United States Patent
Kishida et al.

(10) Patent No.: US 7,195,668 B2
(45) Date of Patent: Mar. 27, 2007

(54) CRUCIBLE FOR THE GROWTH OF SILICON SINGLE CRYSTAL AND PROCESS FOR THE GROWTH THEREOF

(75) Inventors: Yutaka Kishida, Yamaguchi (JP); Teruyuki Tamaki, Yamaguchi (JP)

(73) Assignee: Siltronic AG, Munich (DE)

( * ) Notice: Subject to any disclaimer, the term of this patent is extended or adjusted under 35 U.S.C. 154(b) by 80 days.

(21) Appl. No.: 11/020,858

(22) Filed: Dec. 22, 2004

(65) Prior Publication Data
US 2005/0139153 A1 Jun. 30, 2005

(30) Foreign Application Priority Data
Dec. 26, 2003 (JP) .............................. 2003-435062
Sep. 17, 2004 (JP) .............................. 2004-272074

(51) Int. Cl.
C30B 15/20 (2006.01)

(52) U.S. Cl. ............... 117/13; 65/374.15; 117/200; 117/900

(58) Field of Classification Search ............... 117/13, 117/200, 900; 65/374.15, DIG. 8
See application file for complete search history.

(56) References Cited

U.S. PATENT DOCUMENTS

| | | | |
|---|---|---|---|
| 5,567,399 A | 10/1996 | Von Ammon et al. | |
| 6,036,776 A | 3/2000 | Kotooka et al. | |

FOREIGN PATENT DOCUMENTS

| | | |
|---|---|---|
| DE | 199 02 302 A1 | 7/2000 |
| GB | 2 207 617 A | 2/1989 |
| JP | 58 208193 A | 12/1983 |
| JP | 63 256593 A | 10/1988 |
| JP | 06 114192 A | 4/1994 |
| JP | 06 321678 A | 11/1994 |
| JP | 11 092272 A | 4/1999 |

OTHER PUBLICATIONS

Jones, A.W.D, "Scaling Analysis of the Flow of a Low Prandtl Number Czochralski Melt," Crystal Growth, 88 (1988), p. 465-476.
Yoshizawa, A., "Ryutai Rikigaku (Fluidynamics)," Tokyo Daigaku Shuppankai, Sep. 5, 2001, p. 75 (only available in Japanese language).
Prof. Greenspan, "The Theory of Rotating Fluids," p. 9.
Richter: "Crystal growing crucible to suppress convection", N.T.I.S. Tech Notes, 1986, pp. 1115-1115, XP002330017, Springfield, VA, USA.
Grabner O et al; "Analysis of turbulent flow in silicon melts by optical temperature measurement", Materials and Engineering B, Elsevier Sequoia, Lausanne, CH, vol. 73, No. 1-3, Apr. 2000, pp. 130-133, XP004192034, ISSN: 0921-5107.
Kakimoto K: "Flow instability during crystal growth from the melt", Progress in Crystal Growth and Characterization of Materials, Elsevier Publishing, Barking, GB, vol. 30, No. 2, 1995, pp. 191-215, XP004048547, ISSN: 0960-8974.

Primary Examiner—Felisa Hiteshew
(74) Attorney, Agent, or Firm—Brooks Kushman P.C.

(57) ABSTRACT

A crucible for the growth of single crystals by the Czochralski method which can enhance the productivity, yield and quality of crystal and a single crystal growing method, wherein the crucible has an inner bottom surface, the profile of which has at least one raised portion symmetrical about the rotary axis of the crucible wherein the periphery of the raised portion is positioned at a distance of from 0.4 to 1.2 times the radius of crystal to be grown from the rotary axis and the height of the raised portion is generally not smaller than 7% and greater than 100% of the radius of crystal to be grown.

20 Claims, 9 Drawing Sheets

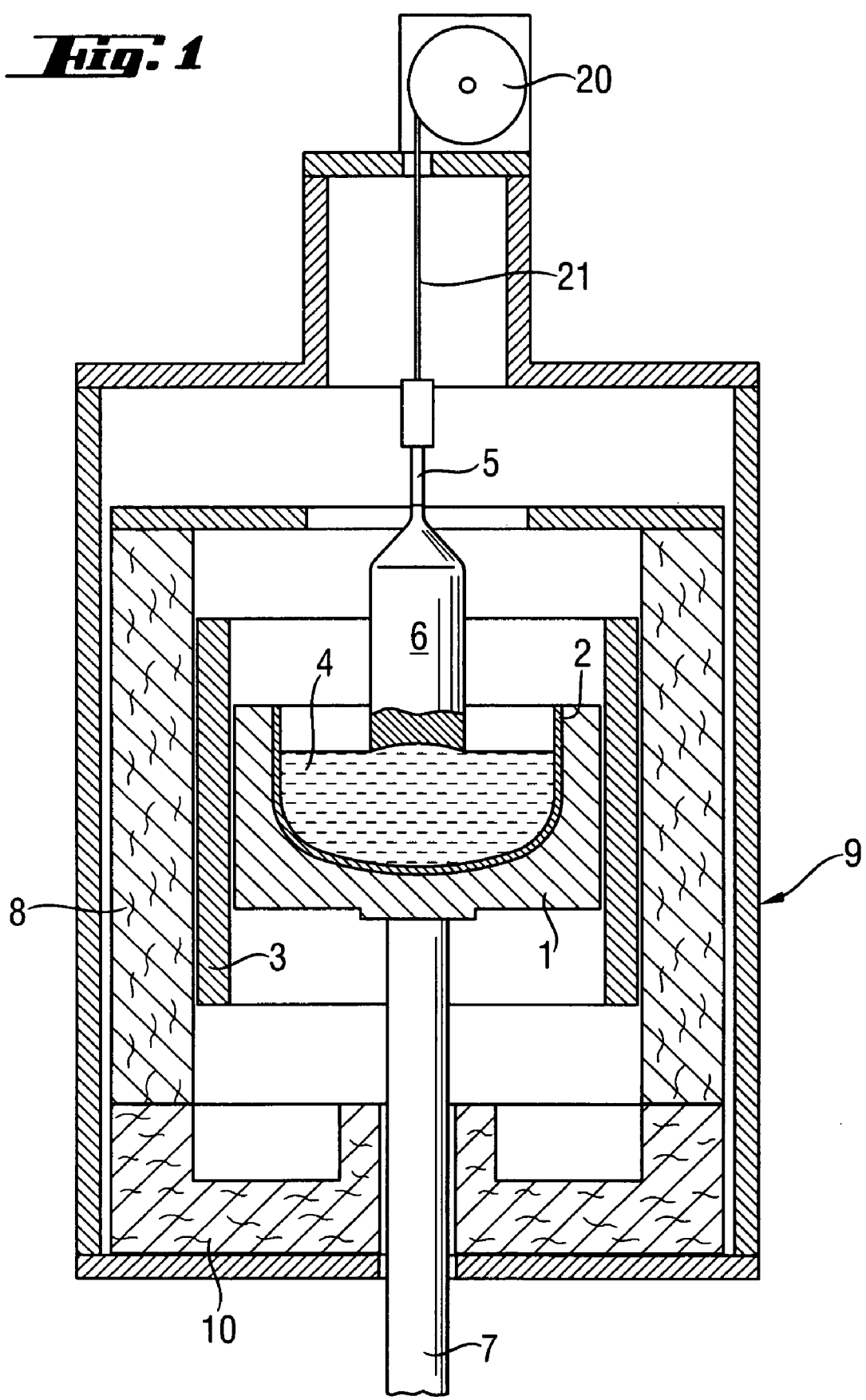

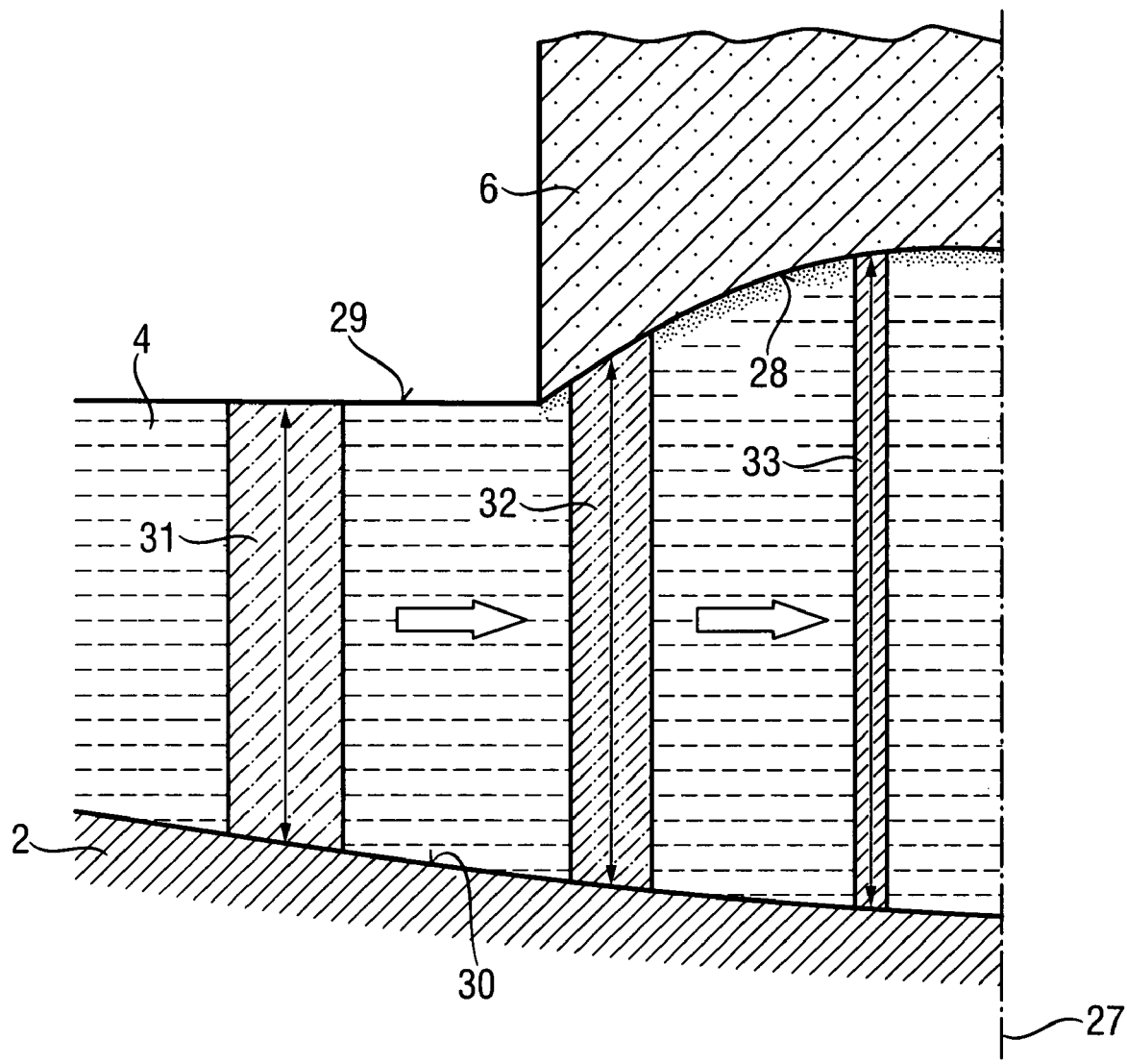

CRUCIBLE FOR THE GROWTH OF SILICON SINGLE CRYSTAL AND PROCESS FOR THE GROWTH THEREOF

BACKGROUND OF THE INVENTION

1. Field of the Invention

The present invention relates to a crucible for the growth of single crystals which can enhance the productivity, yield and quality of such crystals by inhibiting deformation of the growing crystal during growth by the Czochralski method, and to a method for producing single crystals by the Czochralski method using the crucible.

2. Background Art

Various elementary semiconductor crystals and compound semiconductor crystals are employed as substrates for the production of electronic or photoelectronic devices. The Czochralski method (CZ method) is widely used for the production of such single crystals. The CZ method is a favorable method for the production of large-sized crystals, particularly silicon single crystals, which are the mainstay for the production of semiconductor electronic devices today.

SUMMARY OF THE INVENTION

It has now been surprisingly discovered that crystal deformation caused by a rise in crystal growth rate is greatly affected by the profile of the growth interface in the crystal growth direction characteristic of the single crystals and the vertical separation between the crystal and the bottom of the crucible. The growth interface has been found to be related to vortex characteristics in the crucible during crystal growth, which in turn is related to the shape of the crucible lower surface.

BRIEF DESCRIPTION OF THE DRAWINGS

FIG. 1 is a schematic diagram of a CZ method crystal growth furnace;

FIG. 3 is a schematic diagram illustrating the relationship between the change of the thickness of a molten liquid layer and the extension of vortex in a CZ method crucible;

DETAILED DESCRIPTION OF THE PREFERRED EMBODIMENT(S)

The invention thus pertains to a crucible suitable for the growth of single crystals, preferably silicon single crystals, by the Czochralski method, the crucible having an inner bottom surface the profile of which has at least one raised portion symmetrical about the rotation axis of the crucible, the periphery of the raised portion positioned from the rotational axis at a distance of from 0.4 to 1.2 times the radius of crystal to be grown, and the height of the raised portion preferably not smaller than 7% and up to 100% of the radius of crystal to be grown.

The molten liquid from which crystals are grown by the CZ method is given an angular momentum by the rotation of the crucible and the rotation of the growing crystal. The crucible has a far greater contact area with the molten liquid and a greater radius of rotation than crystal. Therefore, the majority of the molten liquid rotates at substantially the same speed as the crucible. Only the portion of the molten liquid in the vicinity of the crystal growth interface rotates at substantially the same speed as the crystal (see A. W. D. Jones, J. CRYSTAL GROWTH, 88, (1988), page 465).

Figure 2A:
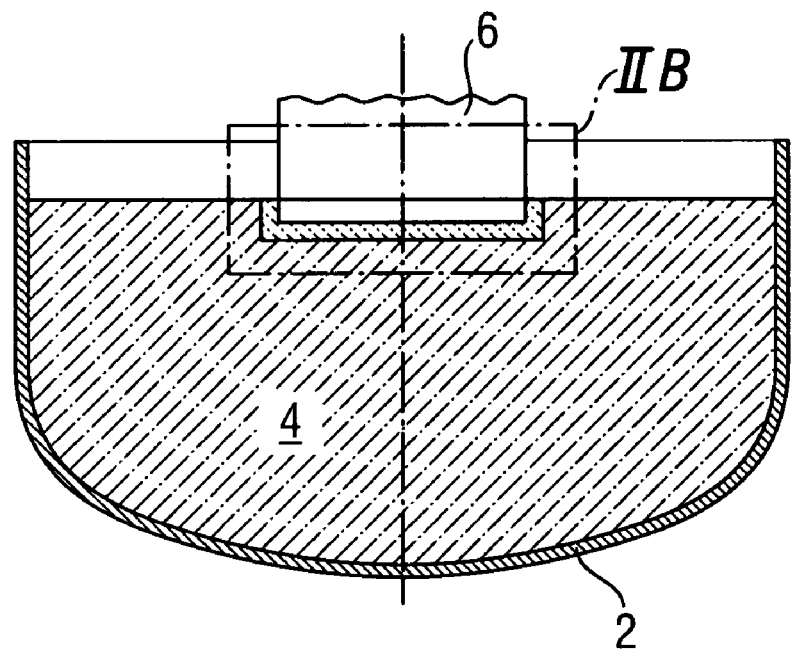
FIG. 2A, B are typical diagrams of molten liquid flow structure in a crucible for CZ method crystal growth.
Figure 2B:
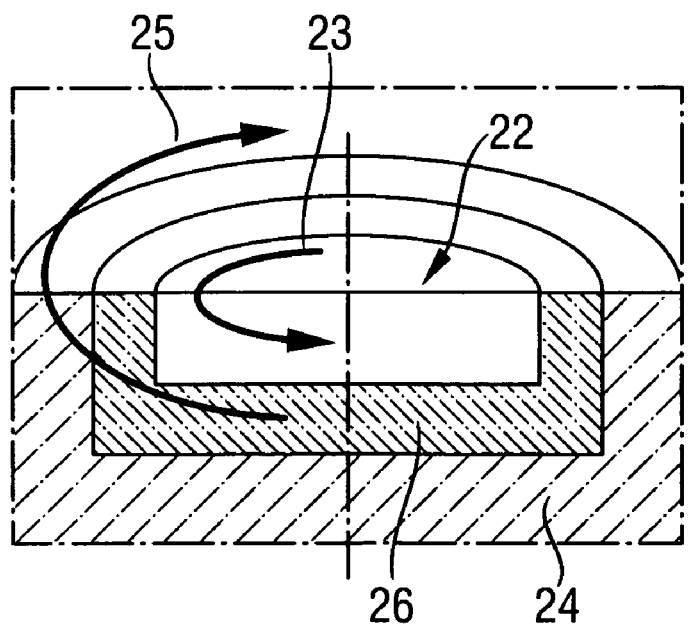

FIG. 2A illustrates the flow structure of a molten liquid in a crucible for the growth of crystals by the CZ method. As shown in the enlarged view (FIG. 2B), a molten liquid in a CZ crucible can fluidynamically be divided into three regions.

The first region is a Cochran boundary layer shown by the reference numeral 22. This is a thin layer which is disposed right under the crystal and rotates in the direction shown by the arrow 23 at substantially the same speed as the crystal. The thickness of this layer is extremely small. In the case of molten silicon, the thickness of this layer falls below 1 mm. This layer has a high rotational moment, is thus relatively stable, and exhibits only a small flow disturbance.

The second region is a rigid body rotation region shown by the reference numeral 24. This layer in the second region experiences thermal convection due to heating by an external heat source, and hence exhibits much flow disturbance. In the ordinary CZ method, however, the rotational speed of the crucible is sufficiently greater than the speed of convection or resulting disturbance. It is therefore thought that this layer rotates together with the crucible in the direction shown by the arrow 25. Accordingly, the vorticity vector of the molten liquid in this region extends substantially along the rotation axis and the vortex extends from the bottom of the crucible to the surface of the molten liquid almost vertically.

The third region is a disc-shaped interlayer region shown by the reference numeral 26 which is disposed between the Cochran boundary layer 22 and the rigid body rotation region 24. It is thought that the thickness of this region is as small as several times that of the Cochran border layer 22 and the radial dimension of this region is about 1.2 times or less the radius of the crystal. This region is acted upon by concentrated shearing forces developed both by the rotation of the crystal and the rotation of the crucible, and thus exhibits a high Reynolds number. This means that the flow of molten liquid can be easily disturbed in this region.

The mechanism of the movement of the vortex tube formed by fluctuations such as thermal convection in the rigid body rotation region of the crucible to the lower portion of the crystal growth interface in a molten liquid of CZ growth method under the aforementioned conditions will be described in connection with FIG. 3.

FIG. 3 is a typical illustration of the change in thickness of a molten liquid and the change in the length of a vortex in a CZ crucible for the growth of silicon crystal on the left side of the central axis 27 of a crystal 6.

The growth interface of the silicon crystal in the CZ method normally expands upward (in the direction of crystal growth). Therefore, in the case of commonly used crucibles, the inner bottom surface of which is spherical, the vertical distance between the crystal growth interface and the inner bottom surface of the crucible increases from the periphery of the crystal toward the central axis of the crystal. When fluctuations such as thermal convection cause a vertically standing vortex tube 31 to enter the crystal from its outside toward the center thereof, the length of the vortex tube increases as shown by vortex tubes 32, 33. As the length of the vortex tube increases, the speed of the rotation of the molten liquid in the vortex tube increases according to vortex conservation laws. At this point, the lower portion of the interlayer is acted upon by a great shearing force caused by the extension of vortex. Thus, the flow of the molten liquid in the lower portion of the interlayer becomes unstable.

Figure 4A:
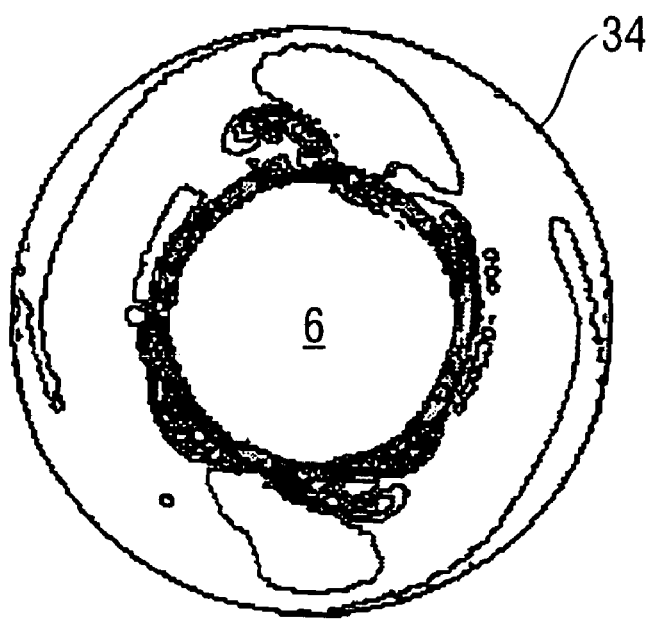
FIGS. 4A, 4B are diagrams illustrating a distribution pattern of vortex and temperature on the surface of a molten liquid during silicon crystal growth, obtained by numerical simulation.
Figure 4B:
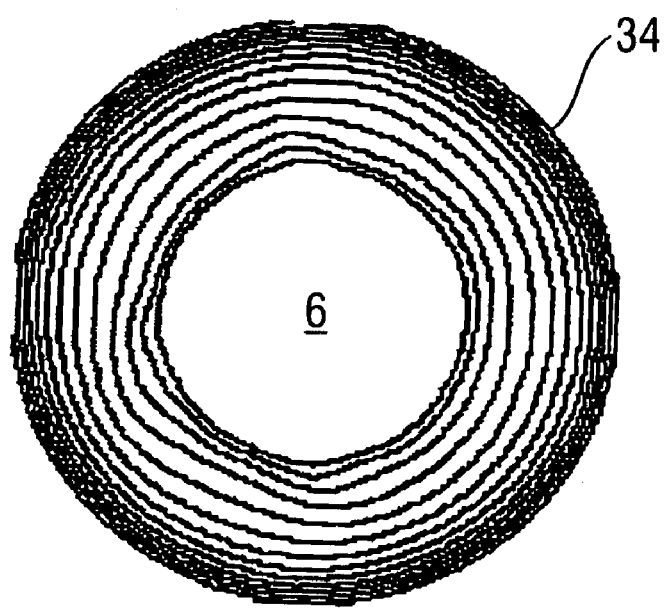

FIG. 4A illustrates a pattern of vortex distribution on the molten liquid surface during the growth of silicon crystal obtained by numerical simulation. FIG. 4B illustrates a pattern of temperature distribution on the molten liquid during the growth of silicon crystal obtained by numerical simulation. In these figures, the reference numeral 6 indicates a crystal and the reference numeral 34 indicates the side wall of the crucible 2.

A circumferentially wavy vortex as shown in FIG. 4A is formed particularly on the periphery of the crystal. At the same time, a circumferentially wavy distorted temperature distribution occurs as shown in FIG. 4B. this temperature distribution has a direct effect on the profile of the crystal growth interface, causing crystal deformation. Further, the circumferentially wavy disturbance accelerates the transportation of heat in the radial direction, causing a drastic reduction of radial temperature gradient dT/dR of the crystal growth interface. The smaller dT/dR, the greater is the degree of freedom of crystal deformation, that is, the more easily crystal deformation can occur.

In order to demonstrate the aforementioned effects, numerical flow simulation was made on the sectional profile of the crystal interface in terms of a trigonometric function having a period of ½ expanding at an amplitude H in the direction of crystal growth assuming silicon crystal growth at a high rate. As a result, the relationship between the circumferential average of the temperature gradient dT/dR of the surface of the molten liquid in contact with the periphery of the crystal and H, the height of the expansion of the crystal, was found as set forth in Table 1. In Table 1, H is normalized relative to the radius of the crystal, as 1. In this numerical flow simulation, it is supposed that the Taylor number of the molten liquid during the rotation of the crucible is $1\times10^{10}$, the radius of the crystal is half that of the crucible and the crystal is rotated at a speed as much as twice that of the crucible in a direction opposite to that of the crucible. Since the molten liquid in the crucible forms a cylindrical region having an aspect ratio of 6, H in this simulation corresponds to the extension of the vortex tube over the range from the end to the center of the crystal.

TABLE 1

Relationship between the expansion of the crystal interface in the direction of crystal growth and the radial temperature gradient of the molten liquid at the periphery of the crystal by numerical flow simulation.

| | Condition 1 | Condition 2 | Condition 3 | Condition 4 |
|---|---|---|---|---|
| Expansion H of crystal interface in the crystal growth direction | −0.1 | 0 | 0.1 | 0.2 |
| Radial temperature gradient dT/dR (° C./min) of surface of molten liquid at periphery of crystal | 1.50 | 1.35 | 1.15 | 0.83 |

As can be seen in the numerical simulation, dT/dR, which is an index of stability to crystal deformation, decreases with the increase of the expansion of crystal interface (i.e., vertical thickness of the molten liquid). This gives rise to a presumption that crystal deformation is related to the expansion and contraction of vortex under the crystal growth interface. On the basis of the aforementioned considerations and the results of simulation, the present invention is directed to modifying the profile of the bottom of the crucible for use in crystal growth, for the purpose of inhibiting the deformation of a silicon crystal grown therein.

From the aforementioned considerations, the profile of the bottom interior surface of the crucible is arranged such that an increase in vertical thickness of the molten liquid layer, taking into account the expanded shape of its interface, is minimized toward the central axis of the crucible, and preferably such that the vertical thickness does not increase toward the central axis. The length of the vortex in the region of crystal growth at the interlayer is thus reduced toward the center of the crucible. Further, since the molten silicon is a viscous fluid, the desired effect can be achieved even if the profile of the bottom of the crucible deviates somewhat from an idealized shape. Accordingly, dT/dR may be increased as long as the bottom of the crucible is extended in the direction of crystal growth to form a raised portion, the radius of which is not more than 1.2 times that of the crystal to be grown.

Figure 5:
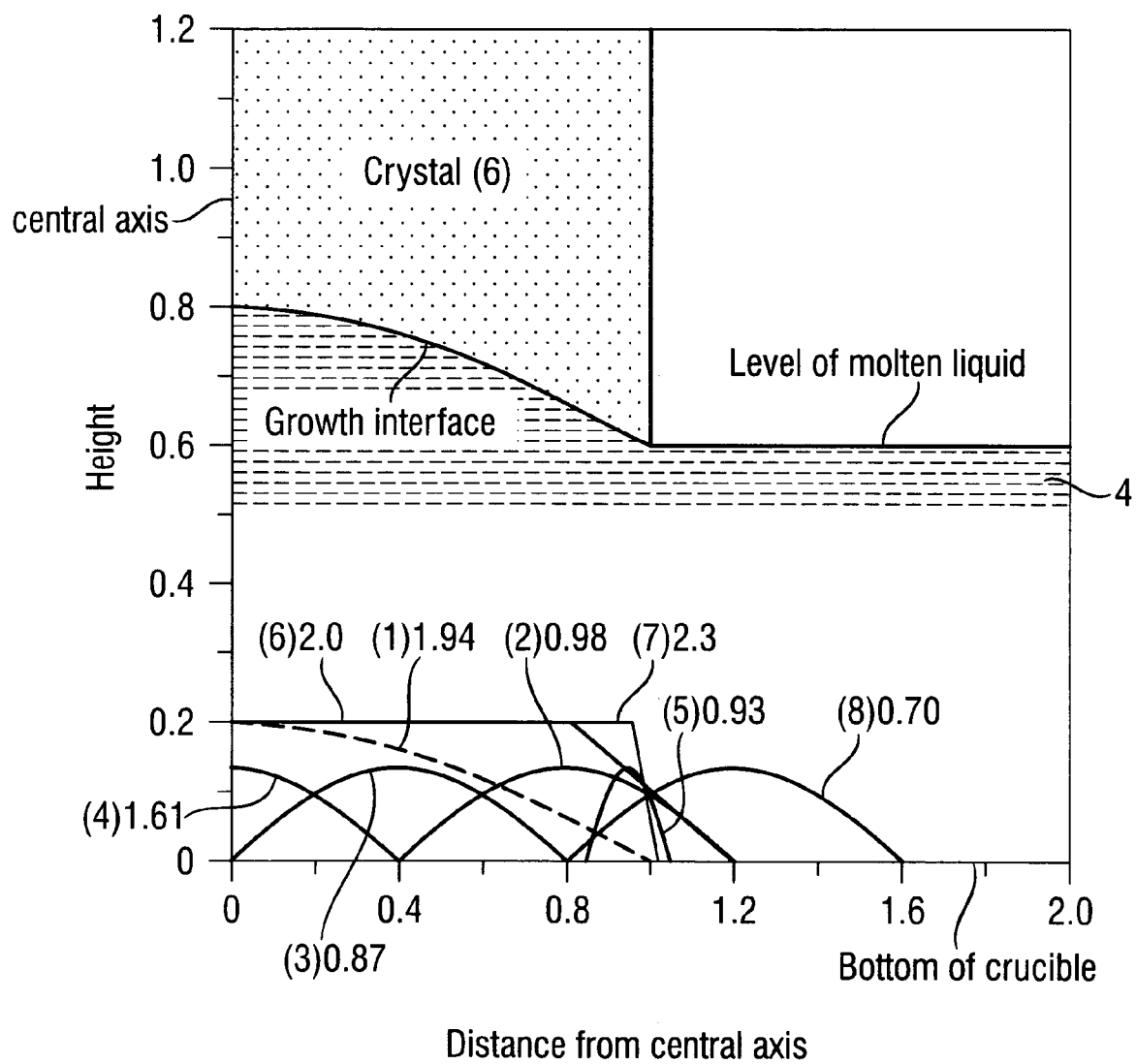
FIG. 5 is a diagram illustrating various profiles of crucible bottom and crystal interface studied by numerical simulation.

Eight types of crucible bottom profiles as described below and as shown in FIG. 5 were subjected to numerical simulation of flow of molten liquid, assuming a profile of crystal interface of Condition 4 as set forth in Table 1, to study the effect of the crucible bottom profile on dT/dR.

Type (1): A crucible, the bottom profile of which is the same as that of the crystal growth interface;

Type (2): A crucible having a half torus raised portion with a height of 0.13 times the radius of crystal to be grown, over a section of from 0.4 to 1.2 times the radius of the crystal, centered on the rotational axis of the crucible;

Type (3): A crucible having a half torus raised portion with a height of 0.13 times the radius of crystal to be grown, over a section of up to 0.8 times the radius of the crystal, centered on the rotational axis of the crucible;

Type (4): A crucible having a half torus raised portion with a height of 0.13 times the radius of crystal to be grown, over a section of up to 0.4 times the radius of the crystal, centered on the rotational axis of the crucible;

Type (5): A crucible having a half torus raised portion with a height of 0.13 times the radius of crystal to be grown, over a section of from 0.85 to 1.05 times the radius of the crystal, centered on the rotation axis of the crucible;

Type (6): A crucible having a truncated cone-shaped raised portion with a height of 0.2 times the radius of crystal to be grown, over a section of from 0.8 to 1.2 times the radius of the crystal, centered on the rotational axis of the crucible;

Type (7): A crucible having a truncated cone-shaped raised portion with a height of 0.2 times the radius of crystal to be grown, over a section of from 0.95 to 1.05 times the radius of the crystal, centered on the rotational axis of the crucible; and Type (8): A crucible having a raised portion with a height of 0.13 times the radius of crystal to be grown, over a section of from 0.8 to 1.6 times the radius of the crystal, centered on the rotational axis of the crucible.

The results of the radial temperature gradient (dT/dR) of the surface of the molten liquid at the periphery of the crystal obtained by simulation made on the crucibles of the aforementioned Types (1) to (8) are set forth in Table 2 below. For comparison, Table 2 also contains the results of a crucible having a plain bottom surface (same as Condition 4 in Table 1), as Type (0).

Table 2 shows the value of dT/dR obtained by numerical simulation made on the various types of crucible wherein profiles, the numerical values of position and height are normalized relative to the radius of the crystal as 1.

In the present invention, therefore, the crucible has a raised portion formed on the inner bottom surface thereof. It is thought that the effect of the present invention differs with the height of the raised portion. The effect of the present invention can be judged by comparing the value of dT/dR thus obtained with that obtained with a crucible having a plain inner bottom surface free of raised portion wherein the crystal growth interface is plain, e.g. free of an upward raised portion.

Figure 6:
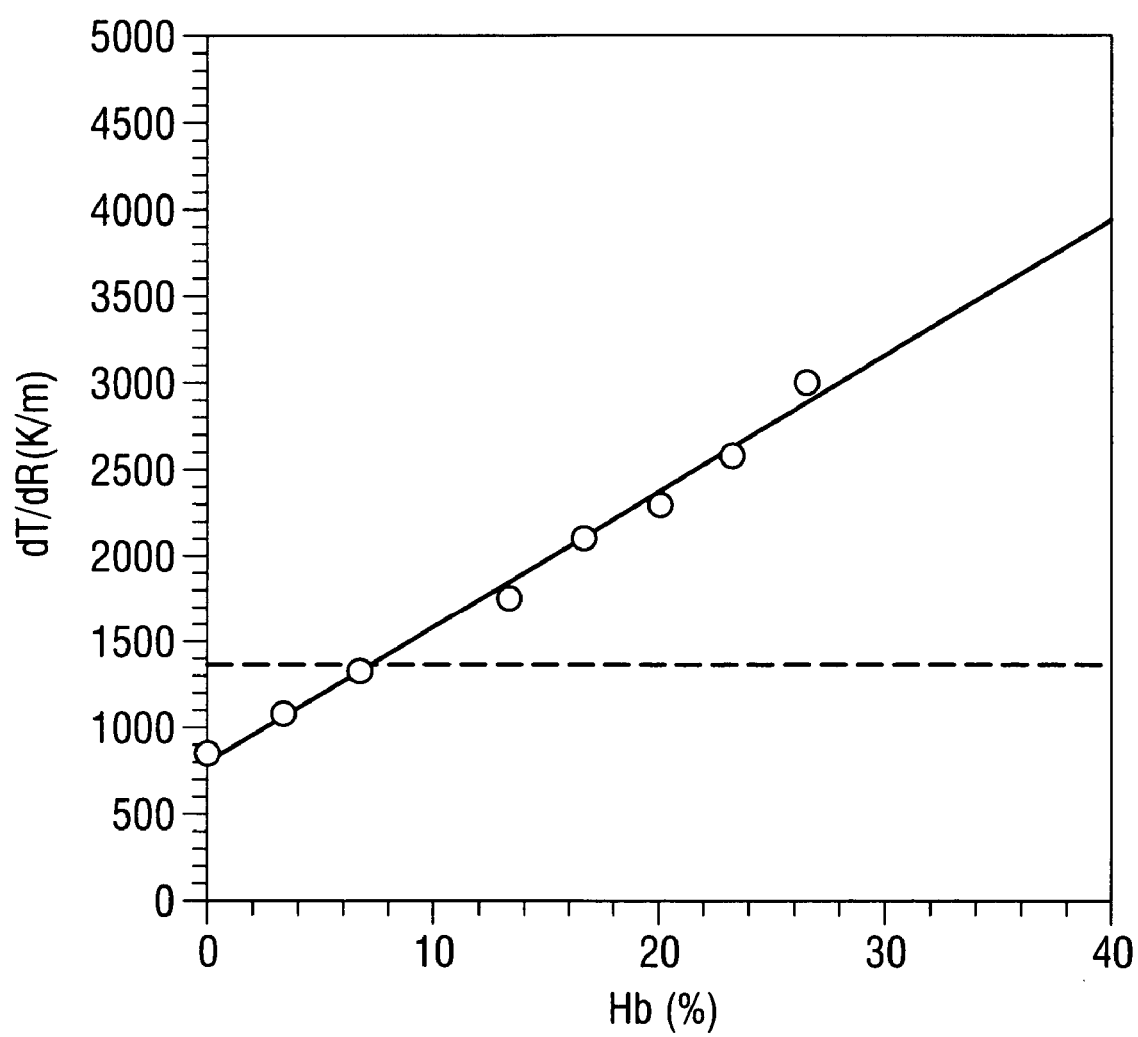
FIG. 6 is a diagram illustrating the relationship between the height of raised portion formed on the inner bottom surface of a crucible of Claim 1 and dT/dR.

FIG. 6 indicates the relationship between dT/dR and height Hb of a raised portion determined on a crucible of Type (7) having different heights of raised portion, by numerical simulation. In FIG. 6, Hb is represented by percentage relative to the radius of the crucible. For reference, the value of dT/dR (1.35° C./mm) determined on the growth of crystal having a plain interface using a crucible having no raised portion on the bottom thereof by numerical simulation is shown by a dotted line.

As can be seen in FIG. 6, dT/dR increases in substantial proportion to the height of the raised portion and when Hb is greater than 7% of the radius of the crystal, dT/dR exceeds 1.35° C./mm, demonstrating that when Hb is greater than 7% of the radius of the crystal. Thus, it is preferable that the height of the raised portion be 7% or more of the radius of the crystals.

The higher the height Hb of the raised portion, the greater is dT/dR and the greater is the effect of the present invention. However, when Hb is too high, the molten liquid disposed at a position lower than the top of the raised portion on the bottom cannot be crystallized in the actual operation, causing the material in that region to be wasted. When the height of the raised portion is greater than the radius of the crystal in the crucible, the waste amount of molten liquid exceeds

TABLE 2

| Profile of crucible | Position of inner end of raised portion | Position of outer end of raised portion | Position of top of raised portion | Height of raised portion | Radial temperature gradient of surface of molten liquid at periphery of crystal (dT/dR (° C./mm)) | Increase of dT/dR relative to Type (O) |
|---|---|---|---|---|---|---|
| Type (1) | 0.0 | 1.0 | 0.5 | 0.20 | 1.94 | 2.3 times |
| Type (2) | 0.4 | 1.2 | 1.0 | 0.13 | 0.98 | 1.18 times |
| Type (3) | 0.0 | 0.4 | 0.2 | 0.13 | 0.87 | 1.04 times |
| Type (4) | 0.0 | 0.4 | 0.0 | 0.13 | 1.61 | 1.94 times |
| Type (5) | 0.85 | 1.05 | 0.95 | 0.13 | 0.93 | 1.12 times |
| Type (6) | 0.0 | 1.2 | 0.0~0.8 | 0.20 | 2.00 | 2.4 times |
| Type (7) | 0.0 | 1.05 | 0.0~0.95 | 0.20 | 2.30 | 2.7 times |
| Type (8) | 0.8 | 1.6 | 1.2 | 0.13 | 0.70 | 0.8 times |
| Type (0) | — | — | — | 0% | 0.83 | — |

As can be seen from the results set forth in Table 2, the crucibles of Types (1) to (7), the profiles of the inner bottom surfaces which have a raised portion with a radius of 1.2 times or less that of the crystal to be grown with respect to the rotational axis of the crucible, have the effect of increasing dT/dR at the periphery of the crystal. On the contrary, the crucibles having a raised portion on the bottom thereof at a position which is not under the crystal as in Type (8) has an effect of decreasing dT/dR rather than increasing dT/dR.

It is also clear that the crucibles of Types (6) and (7), wherein the depth of the profile at the edge of crystal shows a great change, exhibit a dT/dR which increases even when the thickness of the molten liquid at the center of the crystal growth interface increases toward the central axis of the crucible.

the waste amount of tail portion or conical portion of the crystal, which is disadvantageous from an economical point of view.

As mentioned above, the inventive crucible has an inner bottom surface, the profile of which has one or more raised portions symmetrical about the rotation axis of the crucible, wherein the raised portions are positioned at a distance of from 0.4 to 1.2 times the radius of crystal to be grown from the rotational axis and the height of the raised portions is from 7% up to 100% of the radius of crystal to be grown, as illustrated, but not limited, by the profiles of the aforementioned Types (1) to (7).

In a further aspect of the invention, the inner bottom surface of the crucible is profiled over a section disposed from the rotational axis at a distance of from 0.8 to 1.2 times the radius of crystal to be grown, such that the vertical thickness of a molten liquid layer, taking into account the expanded shape of the interface of the molten liquid layer with crystal during the growth of the regular shape portion of crystal, does not increase toward the central axis of the crucible, wherein the inner bottom surface thereof has a raised portion having a height not greater than half the diameter of crystal to be grown. This embodiment is illustrated by the aforementioned Types (2), (3), (5), (6) and (7).

In the latter arrangement, the depth of the molten liquid layer does not increase over a section of from 0.8 to 1.2 times the radius of the crystal to be grown but decreases, e.g. progressively or monotonously toward the center of the crucible over at least a part of the section. Of course, the depth of the molten liquid layer may decrease over the entire section of from 0.8 to 1.2 times the radius of the crystal. Accordingly, the bottom of the crucible may be formed such that the thickness of the molten liquid decreases monotonously over a section of from 1.0 to 1.2 times the radius of the crystal to be grown but remains substantially constant over a section of from 0.8 to 1.0 times the radius of the crystal. Alternatively, the bottom of the crucible may be formed such that the thickness of the molten liquid increases over a section of from 0.9 to 1.3 times the radius of the crystal to be grown but remains substantially constant over a section ranging from 0.9 times the radius of the crystal to the central axis of the crucible. The bottom of the crucible may be formed such that the thickness of the molten liquid remains substantially constant over a section of from 1.0 to 1.3 times the radius of the crystal to be grown but decreases over a section of from 1.0 to 0.7 times the radius of the crystal to be grown or a section ranging from 1.0 times the radius of the crystal to the central axis of the crucible. In other words, it suffices in this embodiment of the invention, if the thickness of the molten liquid does not increase toward the center of the crucible over a section of from 0.8 to 1.2 times the radius of the crystal to be grown, or a portion thereof. In this arrangement, the thickness of the molten liquid does not increase and there is no expansion or contraction of vortex toward the center of the crucible, causing no crystal deformation over a section of at least from 0.8 to 1.2 times the radius of the crystal.

In a further aspect of the invention, the inner bottom surface of the crucible is profiled over a section ranging from the radius of the crystal to be grown to the center of rotation such that the height of the inner bottom surface does not decrease toward the central axis, to thus prevent an increase of the extension of the vortex under the center of the crystal, and the height of the raised portion formed on the inner bottom surface thereof is not greater than half the radius of crystal to be grown. This arrangement is illustrated by crucibles of the aforementioned Types (6) and (7). This arrangement has the effect of increasing dT/dR more than the crucible of Type (3), making it possible to inhibit crystal deformation more effectively.

In order to design the profile of the bottom of crucible according to the invention, the internal profile of the crystal during the growth of regular shape portion of the crystal is preferably known. The internal profile of the crystal during the growth of the regular shape portion can be confirmed by the profile of a striation pattern obtained by observation of a section of a crystal grown in a crucible having a conventional shape by X-ray topography.

The invention is further directed to a process of growing a silicon crystal by the Czochralski method, using one of the inventive crucibles. In this manner, a crystal having a good quality can be grown at a high rate.

The present invention is most useful when the vortex in the rigid body rotation region extends vertically. However, there are cases where thermal convection occurring in the crucible causes the direction of the vortex to deviate from the vertical direction, and as a result, the beneficial effects of the present invention are weakened. In this respect, since it is known that the vertical component of the flow in a rotating vessel is suppressed by the action of Coriolis force accompanying the rotation, see Toru Yoshizawa, "Ryutai Rikigaku (Fluidynamics)", TOKYO DAIGAKU SHUPPANKAI, Sep. 5, 2001, page 75, a stronger action of the Coriolis effect makes it possible to keep the axis of vortex in the molten liquid vertical and hence enhance the effect of the present invention.

Accordingly, in a further aspect of the invention, the rotational speed of the crucible during crystal growth is adjusted such that the Taylor number of the molten liquid is not smaller than $1.0 \times 10^9$. The Taylor number is a dimensionless number that quantifies the intensity of Coriolis force acting on a molten liquid. It is defined by the following relationship:

$$Ta = 4\Omega^2 R^4/\nu$$

wherein $\Omega$ represents the angular velocity of rotation of the crucible; R represents the radius of the crucible; and $\nu$ represents the dynamic viscosity coefficient of the molten liquid.

As mentioned above, in accordance with the present invention, when a vortex in the molten liquid enters right under the crystal, the flow on the side of the crystal growth interface can be kept stable without causing the rotation of the vortex tube to be accelerated according to vortex conservation laws. Further, the temperature distribution at the periphery of the crystal growth interface can be stabilized to inhibit the deformation of growing silicon crystal, making it possible to enhance the productivity of crystal and hence the quality of crystal.

Thus, in accordance with the present invention, the rate of crystal growth can be raised by controlling the rotational speed of the crucible during crystal growth such that the Taylor number of the molten liquid is not smaller than $1.0 \times 10^9$.

The present invention will be further described in the following examples in connection with the attached drawings.

Figure 7:
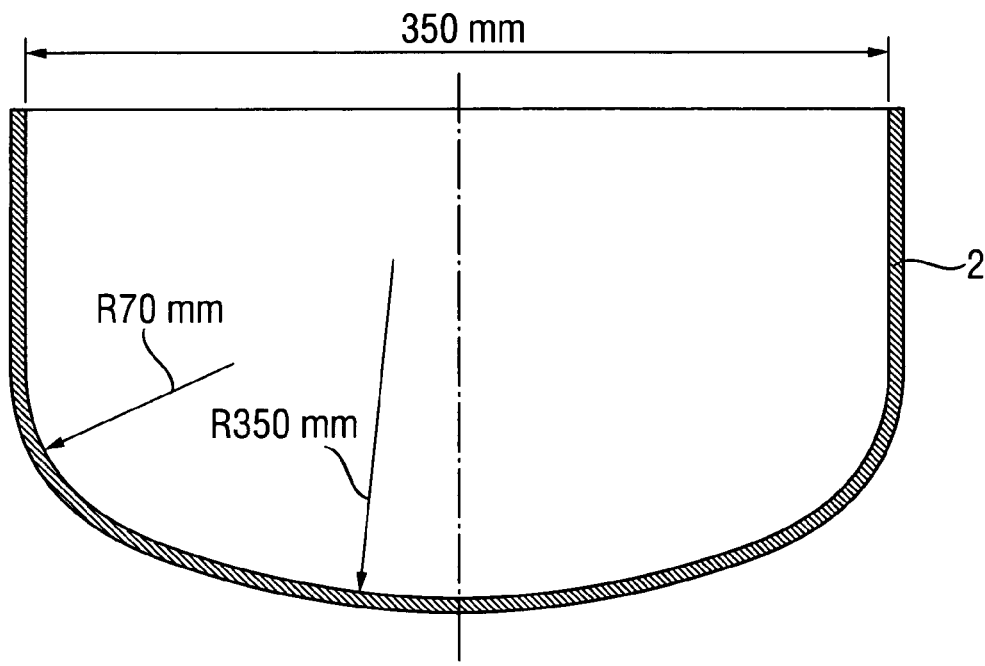
FIG. 7 is a diagram illustrating the profile of a longitudinal section of a comparison example crucible.

FIG. 7 illustrates the profile of a section of a typical crucible made of quartz having an aperture of 350 mm for use in the production of silicon crystal according to the state-of-the-art. This crucible is formed by a vertically extending cylindrical outer wall having an inner diameter of 350 mm and a spherical bottom portion having a radius of 350 mm which are inscribed in an arc wall having a radius of 70 mm.

Figure 8:
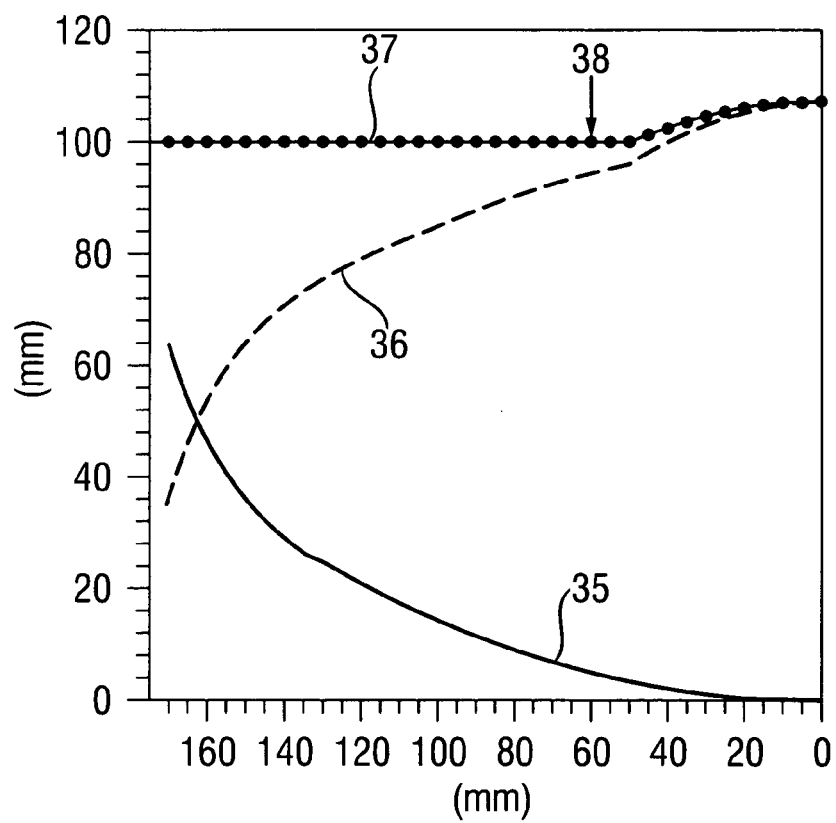
FIG. 8 is a diagram illustrating the radial change of the thickness of a molten liquid layer during the growth of silicon crystal in the crucible of FIG. 7.

FIG. 8 illustrates the change of the vertical length of the molten liquid layer, over a section ranging from the position of the outer wall of the crucible to the position of the central axis in the case of growth of a crystal having a diameter of 100 mm using this crucible, with the change of the profile of growth interface during the growth of regular shape portion of crystal and the profile of the bottom of the crucible.

In FIG. 8, with height in mm as the ordinate and distance from the central axis of the crucible in mm as the abscissa, the height of the inner bottom surface of the crucible extending radially from the central axis of the crucible is shown by the solid line 35, the thickness of the molten liquid layer is shown by the broken line 36, the height of the level of the molten liquid and the crystal growth interface is shown by the dotted line and the position of the periphery of the crystal is shown by the reference numeral 38. As can be seen in FIG. 8, the vertical length of the molten liquid layer increases monotonously from the periphery of the crucible toward the central axis of the crucible.

Figure 9:
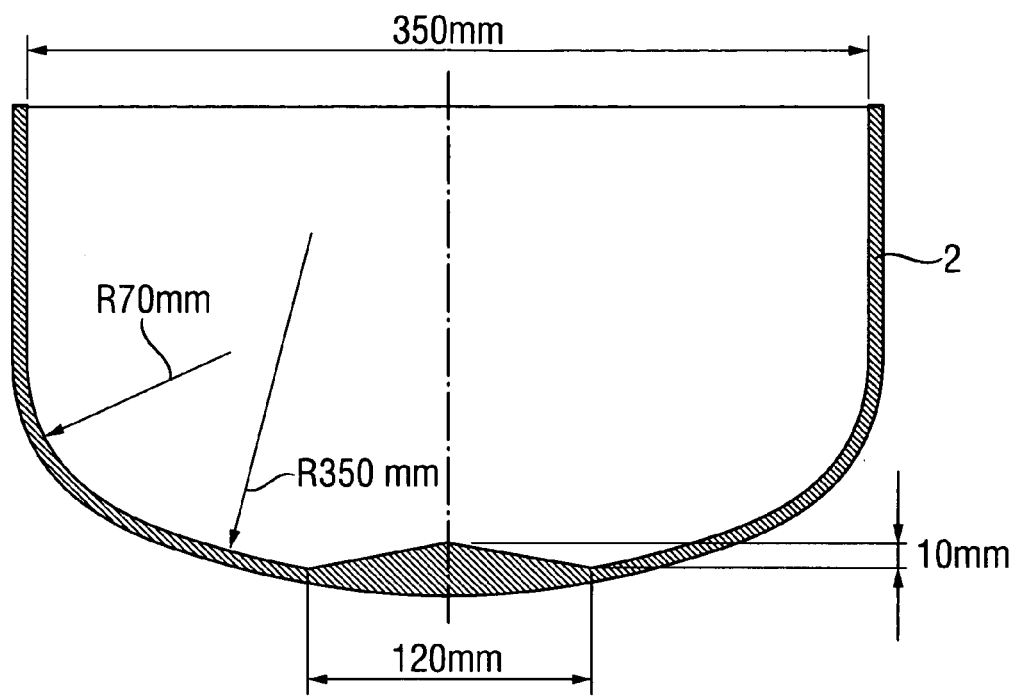
FIG. 9 is a diagram illustrating a longitudinal section of an inventive crucible of Example 1.

FIG. 9 is a longitudinal sectional view illustrating a first embodiment of the crucible of the present invention made of quartz for use in the growth of silicon crystal. This crucible is adapted for the growth of a crystal having a diameter of 100 mm and has the same outer shape as that of Comparison Example 1 shown in FIG. 7 but has a low conical bottom having a height of 10 mm over a section ranging from the center of the bottom of the crucible to a radius of 60 mm.

Figure 10:
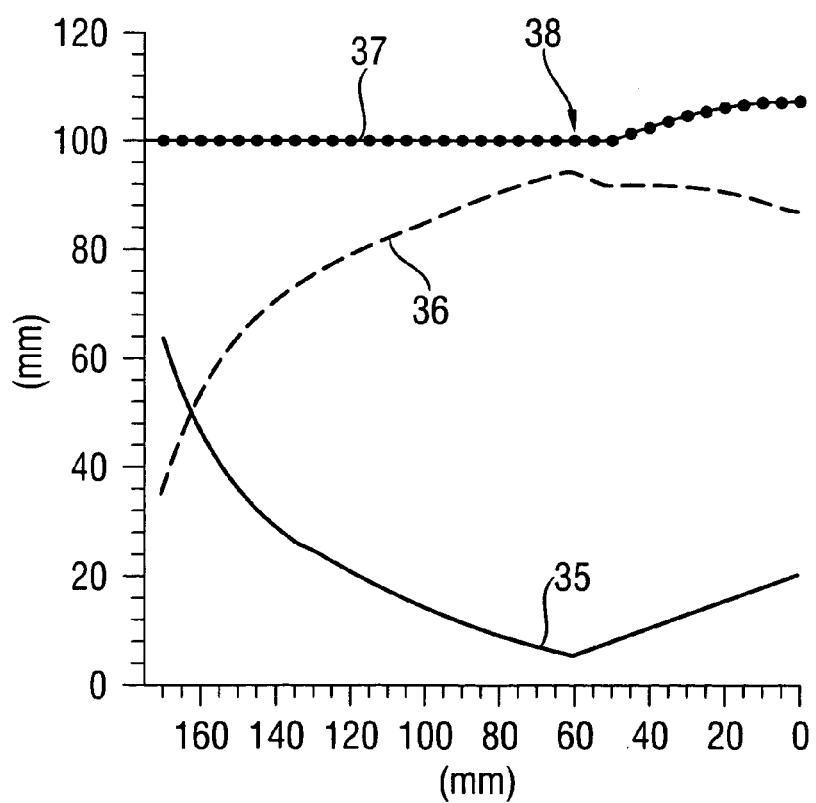
FIG. 10 is a diagram illustrating the radial change of the thickness of the molten liquid layer during the growth of silicon crystal in a crucible having the structure shown in FIG. 9.

FIG. 10 illustrates the change of the vertical thickness of the molten liquid over a section ranging from the periphery of the crucible to the central position of the crucible, in the case of growth of a crystal having a diameter of 100 mm using the crucible shown in FIG. 9, with the change of the profile of the growth interface of the regular shape portion of the crystal and the profile of the bottom of the crucible. In FIG. 10, also, height is in mm as the ordinate and distance from the central axis of the crucible in mm as the abscissa. The height of the inner bottom surface of the crucible extending radially from the central axis of the crucible is shown by the solid line 35, the thickness of the molten liquid layer is shown by the broken line 36, the height of the level of the molten liquid and the crystal growth interface is shown by the dotted line 37, and the position of the periphery of the crystal is shown by the reference numeral 38. The vertical thickness of the molten liquid layer increases monotonously from the position corresponding to the radius of 175 mm toward the center of the crucible to the position corresponding to the radius of 60 mm, which is 1.2 times the radius of the crystal but remains substantially constant over a section ranging from the position corresponding to the radius of 50 mm of the crystal to the position corresponding to the radius of 40 mm, which is 0.8 times the radius of the crystal. In other words, in accordance with this aspect of the present invention, the crucible is profiled such that the vertical thickness of the molten liquid layer, taking into account the shape of the upward expansion of the molten liquid interface at the central part of the crystal during the growth of the regular shape portion of the crystal, does not increase toward the center of the crucible over a section between the positions at which the distance from the central axis of rotation of crucible is at least 0.8 to 1.2 times the radius of the crystal to be grown. While the present embodiment has been described with reference to the case where the inner bottom surface of the crucible is formed conical such that the thickness of the molten liquid layer decreases progressively toward the center of the crystal, from the position corresponding to 30 mm, which is 0.6 times the radius of the crystal to be grown, the inner bottom surface of the crucible may be formed in truncated cone or so-called folded double cone which is a cone having its top folded backward so that the thickness of the molten liquid layer does not increase toward the center of the crucible, that is, the thickness of the molten liquid layer remains constant or decreases monotonously toward the center of the crucible.

Figure 11:
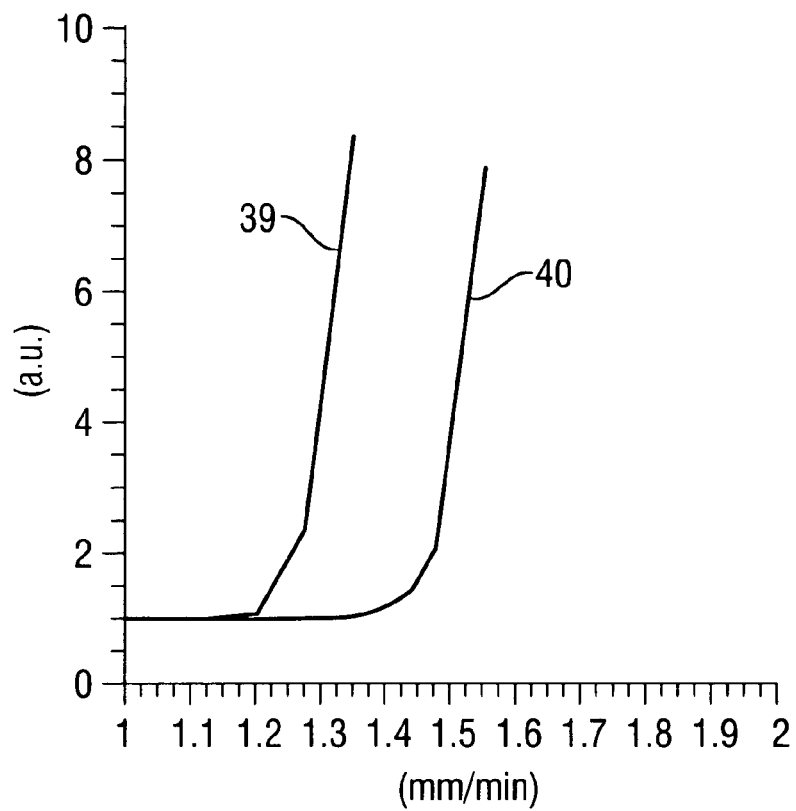
FIG. 11 is a diagram illustrating the relationship between the crystal growth rate and the width of crystal deformation at a Taylor number of $9.2 \times 10^8$ in the case where an inventive crucible of Example 1 and a crucible of Comparison Example 1 of FIG. 7 are used.
Figure 12:
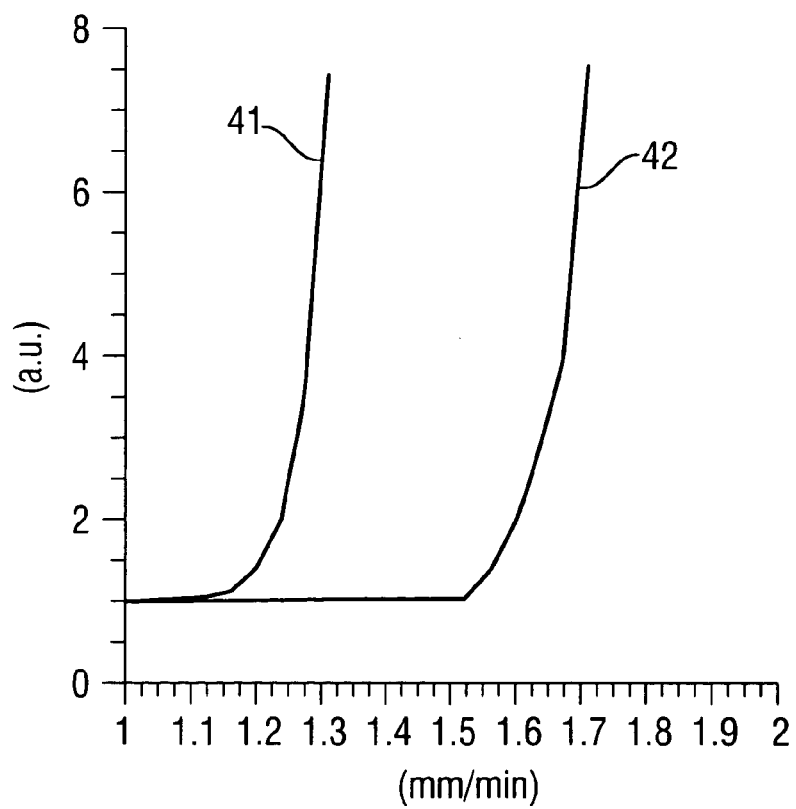
FIG. 12 is a diagram illustrating the relationship between the crystal growth rate and the width of crystal deformation at a Taylor number of $3.0 \times 10^9$ in the case where an inventive crucible of Example 1 and a crucible of Comparison Example 1 of FIG. 7 are used.

FIGS. 11 and 12 are diagrams illustrating the relationship between the rate of crystal growth and the width of deformation of crystal in the case where the conventional crucible of Comparison Example 1 shown in FIG. 7 and the crucible of the inventive example shown in FIG. 9 are used, respectively. In these figures, growth rate is plotted in mm/min as the abscissa and width of deformation is plotted in arbitrary units as the ordinate. The width of crystal deformation is determined by taking the difference between the maximum and minimum values of the position of the periphery of crystal developed when the crystal makes one rotation, and then subjecting the difference to calculation by an image processor.

FIGS. 11 and 12 each illustrate the relationship between the pulling rate and the change of crystal radius developed when a crystal having a diameter of 100 mm is grown from 40 kg of a material dissolved in the respective crucible at gradually changing rate while being rotated at a constant crystal rotation speed of 15 rpm.

FIG. 11 shows the results obtained by rotating the crucible at a constant rate of 1.8 rpm with the Taylor number of the molten liquid kept at $9.20 \times 10^8$, wherein Comparison Example 1 is shown by curve 39 and the inventive example is shown by curve 40. In the case of crystal growth using the crucible having the ordinary profile of Comparison Example 1, when the pulling rate is 1.2 mm/min or more, crystal deformation occurs and the amplitude of diameter change rapidly increases, making it necessary to reduce the pulling rate. On the other hand, when a crucible having an inventive bottom profile is used, no crystal deformation occurs, even when the pulling rate is raised to 1.2 mm/min. When the pulling rate is raised to 1.4 mm/min, crystal deformation begins and a large diameter change occurs. In other words, the use of the crucible having the inventive structure allows higher speed crystal growth without causing crystal deformation.

FIG. 12 shows the results of tests made in the same manner as mentioned above except that the rotation speed of the crucible was adjusted to a higher rate such that the Taylor number of the molten liquid in the crucible is $3.0 \times 10^9$. In FIG. 12, the results of the use of the crucible having the conventional profile of Comparison Example 1 shown in FIG. 7 are shown by curve 41 and the results of the use of a subject invention crucible of Example 1 shown in FIG. 8 are shown by curve 42.

In the case of the conventional crucible of Comparison Example 1, when the pulling rate is 1.1 mm/min or more, crystal deformation occurs causing a drastic increase in the amplitude of diameter change, making it necessary to reduce the pulling rate. In the case of the inventive crucible, however, no crystal deformation occurs even when the pulling rate is raised to 1.4 mm/min. The crystal diameter begins to change only when the pulling is was raised to 1.5 mm/min. In other words, when the Taylor number of the molten liquid in the crucible is higher so as to elevate the Coriolis force, the effect of the present invention can be considerably extended, making it possible to perform higher crystal growth rates.

In the figures, the reference numerals correspond to the following: susceptor (1); crucible (2): heater (3); molten liquid (4); seed crystal (5); crystal (6); insulating material (8); furnace (9); insulating material (10); crystal driving mechanism (20); wire (21); Cochran boundary layer (22); direction of rotation of crystal (23); rigid body rotation region (24); direction of rotation of crucible (25); interlayer (26); central axis of rotation (27); crystal growth interface (28); free surface of molten liquid (29); bottom of crucible (30); vortex tube (31, 32, 33); side wall of crucible (34); height of bottom of crucible (35); thickness of molten liquid layer (36); level of molten liquid (37); periphery of crystal (38); curve illustrating the relationship between the crystal growth rate and the width of crystal deformation of comparison example (39); curve illustrating the relationship between the crystal growth rate and the width of crystal deformation of Example 1 of the present invention (40); curve illustrating the relationship between the crystal growth rate and the width of crystal deformation of Comparison Example 1 (41); and curve illustrating the relationship between the crystal growth rate and the width of crystal deformation of Example 1 of the present invention (42).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. In a process for the growth of a single crystal by the Czochralski method from molten liquid in a generally cylindrical crucible having an interior bottom surface, wherein molten liquid is located between a lowermost surface of a growing crystal and the interior bottom surface of the crucible, the improvement comprising selecting as the crucible a crucible having a bottom profile wherein the difference between the vertical depth of molten liquid below the edges of the growing crystal and the vertical depth of the molten liquid below the center of the growing crystal is less than the difference in height, in a direction parallel to the rotational axis of the crystal, between the edges of the crystal and the center of the growing crystal.

2. The process of claim 1, wherein the crucible has an interior bottom surface having a radially symmetrical raised portion, the raised portion meeting a generally downwardly extending interior bottom surface of the crucible at a distance of from 0.4 r to 1.2 r from a central axis of the generally cylindrical crucible to form a periphery of the raised portion.

3. The process of claim 2, wherein the raised portion is everywhere higher than the periphery in a direction parallel to the central axis, by an amount of from 0.07 r to r.

4. A process for the growth of a single crystal semiconductor having a mean radius r over a regular shape portion thereof from molten liquid in a crucible by the Czochralski method, comprising:

melting semiconductor material in a crucible of claim 1, said crucible having vertically extending side walls rotationally symmetrical about a central axis, and an interior bottom surface extending downwardly from the side walls towards the central axis, the interior bottom surface interrupted by at least one raised portion radially symmetric about the central axis and bounded by a circular periphery where the raised portion meets the bottom surface, the periphery having a radius of 0.4 r to 1.2 r and the raised portion having a height above the periphery in a direction parallel to the central axis of from 0.07 r to 1.0 r.

to form a molten liquid contained in said crucible, and pulling a single crystal semiconductor from said molten liquid.

5. The process of claim 4, wherein the raised portion has a maximum height which is higher than the periphery in a direction parallel to the central axis of less than or equal to r.

6. The process of claim 4, wherein the raised portion is in the form of a half torus.

7. The process of claim 4, wherein the raised portion is everywhere higher than the periphery in a direction parallel to the central axis.

8. The process of claim 4, wherein the raised portion is in the form of a truncated cone.

9. The process of claim 4, wherein the crucible and a single crystal being pulled from said molten liquid are rotated with respect to each other.

10. The process of claim 4, wherein the crucible is rotated, and the rotational speed is such that the Taylor number of the molten liquid is not less than $1.0 \times 10^9$.

11. The process of claim 4, wherein the molten liquid comprises silicon.

12. A generally cylindrical crucible suitable for growth of a single crystal by the Czochralski method, the crystal having a mean radius r over a regular shape portion thereof, the crucible having vertically extending side walls rotationally symmetrical about a central axis, and an interior bottom surface extending downwardly from the side walls towards the central axis, the interior bottom surface interrupted by at least one raised portion radially symmetric about the central axis and bounded by a circular periphery where the raised portion meets the bottom surface, the periphery having a radius of 0.4 r to 1.2 r and the raised portion having a height above the periphery in a direction parallel to the central axis of from 0.07 r to 1.0 r.

13. The crucible of claim 12 wherein the raised portion has a maximum height which is higher than the periphery in a direction parallel to the central axis of less than or equal to r.

14. The crucible of claim 12, wherein the raised portion is in the form of a half torus.

15. The crucible of claim 12, wherein the raised portion is everywhere higher than the periphery in a direction parallel to the central axis.

16. The crucible of claim 12, wherein the raised portion increases in height in a direction parallel to the central axis, from the periphery to the central axis.

17. The crucible of claim 12, wherein the raised portion is in the form of a truncated cone.

18. In a generally cylindrical crucible suitable for the growth of a single crystal by the Czochralski method, having a side wall radially symmetrical about a central axis and an interior bottom surface, the single crystal having a mean radius r over a regular shape portion thereof, and a crystal growth surface bounded by the outermost edges of the crystal, and including an inner growth region the lower surface of which is higher than the outermost edges in a direction away from the interior bottom surface of the crucible, the improvement comprising profiling the interior bottom surface of the crucible in a radially symmetrical manner beginning at a point from 0.8 r to 1.2 r from the central axis and extending towards the central axis such that the vertical thickness of molten liquid, including the interface of molten liquid with the lower surface of the inner growth region, which is between the crucible interior bottom surface and the inner growth region does not increase toward the central axis.

19. The crucible of claim 18, wherein the profiling comprises providing a raised portion of the interior bottom surface which terminates in a periphery where the raised portion contacts an interior bottom surface which extends downwardly from the side wall of the crucible, the periphery located from 0.8 r to 1.2 r from the central axis of the crucible, and the raised portion having a maximum height of r in a direction parallel to the central axis.

20. The crucible of claim 19, wherein the maximum height of the raised portion is less than r.

* * * * *